(12) United States Patent  
Sleeman

(10) Patent No.: US 8,823,675 B2  
(45) Date of Patent: Sep. 2, 2014

(54) CAPACITIVE MATRIX TOUCH SENSOR

(75) Inventor: Peter Sleeman, Waterlooville (GB)

(73) Assignee: Atmel Corporation, San Jose, CA (US)

(*) Notice: Subject to any disclaimer, the term of this patent is extended or adjusted under 35 U.S.C. 154(b) by 982 days.

(21) Appl. No.: 12/572,944

(22) Filed: Oct. 2, 2009

(65) Prior Publication Data

US 2010/0085327 A1 Apr. 8, 2010

Related U.S. Application Data

(60) Provisional application No. 61/102,830, filed on Oct. 4, 2008.

(51) Int. Cl.  
*G06F 3/045* (2006.01)  
*H03K 17/96* (2006.01)

(52) U.S. Cl.  
CPC ...... *H03K 17/962* (2013.01); *H03K 2017/9604* (2013.01); *H03K 2217/960785* (2013.01); *H03K 2017/9602* (2013.01); *H03K 17/9622* (2013.01); *H03K 2217/96079* (2013.01); *H03K 2217/96076* (2013.01); *H03K 2217/960795* (2013.01); *H03K 2217/960725* (2013.01)  
USPC .......... 345/174; 345/168; 345/169; 200/512; 200/600; 200/511; 341/34; 341/33; 178/18.06

(58) Field of Classification Search  
USPC ............... 345/174, 168, 169, 173; 178/18.06; 200/5 A, 600, 511, 512; 341/22, 33, 34  
See application file for complete search history.

(56) References Cited

U.S. PATENT DOCUMENTS

| | | | |
|---|---|---|---|
| 3,797,630 A * | 3/1974 | Zilkha | 400/479.1 |
| 4,458,293 A * | 7/1984 | Cherry | 341/33 |
| 5,917,165 A | 6/1999 | Platt et al. | |
| 6,042,249 A | 3/2000 | Spangenberg | |
| 6,096,561 A | 8/2000 | Tayi | |
| 6,452,514 B1 * | 9/2002 | Philipp | 341/33 |
| 7,663,607 B2 | 2/2010 | Hotelling | |
| 7,834,287 B2 * | 11/2010 | Heiman et al. | 200/600 |
| 7,875,814 B2 | 1/2011 | Chen | |
| 7,920,129 B2 | 4/2011 | Hotelling | |
| 8,031,094 B2 | 10/2011 | Hotelling | |

(Continued)

FOREIGN PATENT DOCUMENTS

CN 1964192 A 5/2007  
DE 201 19 700 U1 * 11/2001 ........... H03K 17/955

(Continued)

OTHER PUBLICATIONS

International Application Serial No. PCT/GB2009/002357, Search Report Feb. 25, 2008.

(Continued)

*Primary Examiner* — Lun-Yi Lao  
*Assistant Examiner* — Olga Merkoulova  
(74) *Attorney, Agent, or Firm* — Baker Botts LLP

(57) ABSTRACT

A device includes a substrate, a top touch panel, and an electrode supported by the substrate including a conductive compressible material extending from the substrate to the top touch panel. Another electrode is supported by the substrate and arranged to form an electric field coupling with the electrode including the compressible material. A touch sensitive region is transferred from the substrate to the top touch panel by the compressible material.

22 Claims, 7 Drawing Sheets

(56) References Cited

U.S. PATENT DOCUMENTS

| | | |
|---|---|---|
| 8,031,174 B2 | 10/2011 | Hamblin |
| 8,040,326 B2 | 10/2011 | Hotelling |
| 8,049,732 B2 | 11/2011 | Hotelling |
| 8,168,908 B2 * | 5/2012 | Heimann ............... 200/600 |
| 8,179,381 B2 | 5/2012 | Frey |
| 2005/0089444 A1 | 4/2005 | Justin et al. |
| 2005/0179673 A1 | 8/2005 | Philipp |
| 2007/0103451 A1 * | 5/2007 | Heimann et al. ............ 345/173 |
| 2009/0315854 A1 | 12/2009 | Matsuo |
| 2012/0242588 A1 | 9/2012 | Myers |
| 2012/0242592 A1 | 9/2012 | Rothkopf |
| 2012/0243151 A1 | 9/2012 | Lynch |
| 2012/0243719 A1 | 9/2012 | Franklin |
| 2013/0076612 A1 | 3/2013 | Myers |

FOREIGN PATENT DOCUMENTS

| | | |
|---|---|---|
| EP | 0858166 A1 | 12/1988 |
| EP | 0869613 A2 | 7/1998 |
| WO | WO 2012/129247 | 9/2012 |

OTHER PUBLICATIONS

International Application Serial No. PCT/GB2009/002357, International Search Report mailed Jan. 14, 2010, 5 pgs.

International Application Serial No. PCT/GB2009/002357, International Written Opinion mailed Jan. 14, 2010, 6 pgs.

State Intellectual Office (SIPO) of the People's Republic of China, Chinese First Office Action, Search Report, English Translation of text of the First Office Action, and English Translation of text of the Search Report, Chinese Pattent Appl. No. 200980139696.3, received from Foreign Associate on Apr. 15, 2013.

U.S. Appl. No. 61/454,936, filed Mar. 21, 2011, Myers.

U.S. Appl. No. 61/454,950, filed Mar. 21, 2011, Lynch.

U.S. Appl. No. 61/454,894, filed Mar. 21, 2011, Rothkopf.

* cited by examiner

CAPACITIVE MATRIX TOUCH SENSOR

RELATED APPLICATIONS

This application claims the benefit under 35 U.S.C. 119(e) of U.S. Provisional Patent Application Ser. No. 61/102,830, filed on Oct. 4, 2008, which is incorporated herein by reference in it entirety.

BACKGROUND

Using a charge transfer capacitive measurement approach, such as that described in U.S. Pat. No. 6,452,514, it is possible to create touch sensing regions that can detect human touch through several millimeters of a plastic or glass front panel. In prior devices, the electrodes are formed on a separate substrate that is glued or held in contact with the front panel, and this panel is then electrically interconnected to a main printed circuit board (PCB) using wires in the form of a connector, or wiring loom. The interconnect can also be somewhat problematic because it can move, causing changes in capacitance and it also introduces some fixed amount of stray capacitance that acts to desensitize the touch control.

In the above charge transfer capacitive measurement approach, a transmit-receive process is used to induce charge across the gap between an emitting electrode and a collecting electrode (the transmitter and the receiver respectively, also referred to as X and Y). As a finger touch interacts with the resulting electric field between the transmitter and receiver electrodes, the amount of charge coupled from transmitter to receiver is changed. A particular feature of the above approach is that most of the electric charge tends to concentrate near sharp corners and edges (a well known effect in electrostatics). The fringing fields between transmitter and receiver electrodes dominate the charge coupling. Compatible electrode design therefore tends to focus on the edges and the gaps between neighboring transmitter and receiver electrodes in order to maximize coupling and also to maximize the ability of a touch to interrupt the electric field between the two, hence giving the biggest relative change in measured charge. Large changes are desirable as they equate to higher resolution and equally to better signal to noise ratio.

A specially designed control chip can detect these changes in charge. It is convenient to think of these changes in charge as changes in measured coupling capacitance between transmitter and receiver electrodes (charge is rather harder to visualize). The chip processes the relative amounts of capacitive change from various places around the sensor and uses this to detect the presence of a touch on a touch button. Commonly, these electrodes are required to be transparent so that light can pass through the touch sensor to provide aesthetic and/or functional illumination effects.

An advantage of the charge transfer capacitive measurement approach is that many touch sensors can be formed at a lower "cost per sensor" than other techniques. This is because the intersection between every X and Y electrode can form a touch sensor. For example, a system that has 10 X electrodes and 8 Y electrodes can be used to form 80 touch sensors. This requires only 18 pins on a control chip, whereas an equivalent open-circuit sensing scheme would need 80.

The charge transfer capacitive measurement approach is a transmit-receive architecture that uses a two-part electrode design. A typical prior-art electrode design is show in FIG. 1. Here a transmit 100 and receive 101 element are shown that serve to couple an electric field 102 between the two.

In FIG. 2, the prior art electrode design is shown in cross section with the transmit 200 and receive 201 elements bonded or pushed against an insulating front panel 202. The electric field 203 coupled between the two elements can be disrupted 204 by the presence of a finger or other touching object 205. This serves to decrease the mutual capacitance from transmit to receive element, this change being sensed by a control circuit 206 to register an output 207 to indicate the presence (or not) of the touch 205.

SUMMARY

A touch sensitive device includes transmit and receive electrodes separating a substrate and a touch panel. Selected electrodes may be formed of conductive compressible material compressed between the substrate and the touch panel. Some electrodes are supported by the substrate and are arranged to form an electrical field coupling with the conductive compressible electrodes. The electrical field coupling is configured to change in response to a touch event of the touch panel near a conductive compressible electrode. In some embodiments, electrodes may be transparent to allow illumination through the electrode. In some embodiments, electrodes may include holes to allow illumination through the touch panel from light sources supported by the substrate.

DETAILED DESCRIPTION

A structure for a touch control uses a compressible conductive material to form a touch sensitive region at some distance from a control circuit. Using traditional capacitive sensing methods that rely on an open-circuit electrode arrangement, it is easy to use a conductive spring or other compressible material to transfer the touch sensitive region from a substrate, such as a control printed circuit board (PCB) up to a front panel. In some embodiments, no special interconnection is required at the front panel; the "spring" simply pushes up against the front panel and has sufficient surface area when compressed to form a touch control. As a result, significant cost savings can be realized during assembly because the whole sensor PCB becomes self contained with the "springs" installed onto conductive traces on the PCB. The PCB itself is then fixed in place relative to the front panel with the "springs" held in compression to ensure a mechanically stable system (import for capacitive touch controls as any movement can cause fluctuations in the signals measured from the sensor).

A charge transfer capacitive measurement approach, such as described in U.S. Pat. No. 6,452,514, (or other transmit receive method) may be used with a touch sensitive device having a mechanical "spring" arrangement between a control printed circuit board (PCB) and a front panel. It should be understood that any compressible conductive material could be used to form this "spring". So long as the electrical resistivity of the spring is moderately low, such as for example, below 100 Kohms in one embodiment, then any compressible conductive material, such as metal or plastic springs, open or closed cell foam or further such materials may be used. In some embodiments, the resistivity may be 10K ohms, or 1K ohms or less.

It should be noted that the examples cited place the transmit and receive elements on the same plane and hence require only one layer to implement on a substrate. It is equally possible to form a charge transfer capacitive measurement touch sensor across two layers i.e. with X below Y.

Figure 1:
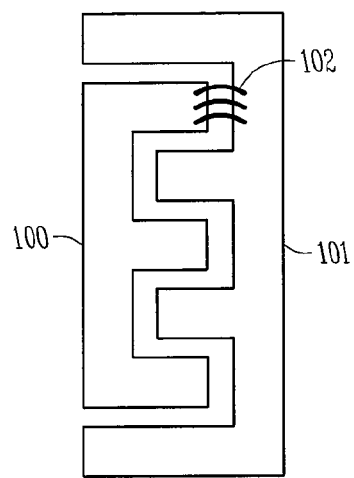
FIG. 1 is a top view of a prior art layout of electrodes for a capacitive based touch sensor.
Figure 2:
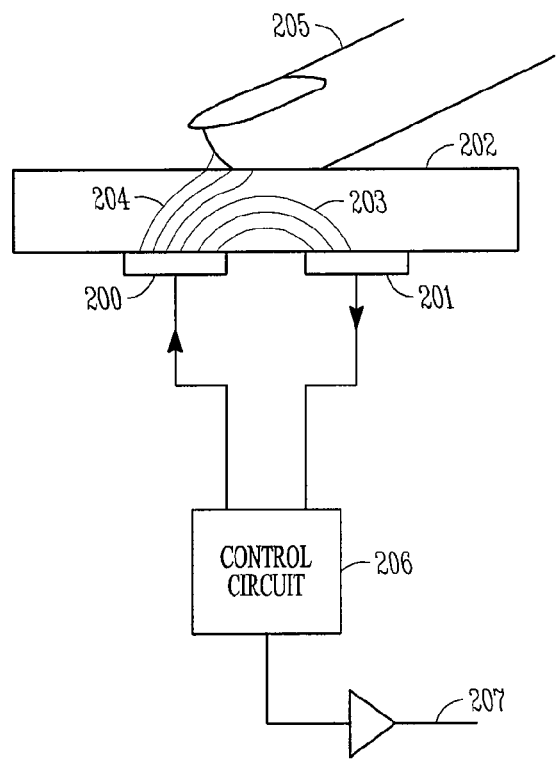
FIG. 2 is cross section of the prior art layout of FIG. 1.
Figure 3:
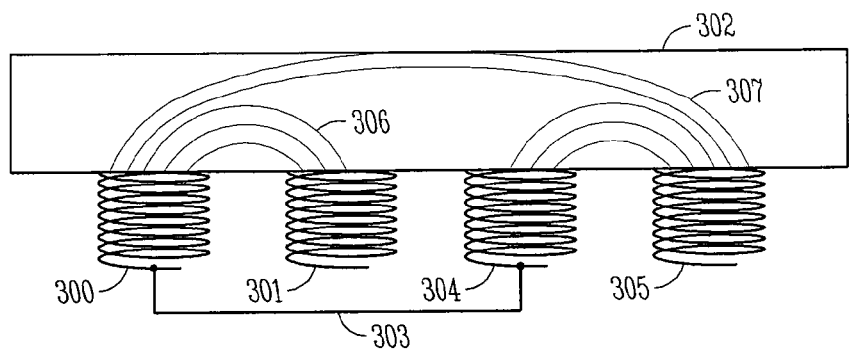
FIG. 3 is a cross section of an electrode configuration using springs between the electrodes and a front panel according to an example embodiment.

One way to use springs to transfer the "intersection" of X and Y up to a front panel includes the use of two concentric or side-by-side springs on a substrate such as the control board, or any other type of substrate, such as a piece of plastic sheet such as PET or polycarbonate, a glass layer, or other material suitable for supporting electrodes. The substrate may provide a mechanical support with electrical connections to the electrodes by use of discrete wiring. This example embodiment is shown in FIG. 3. Here a first X spring 300 and a first Y spring 301 are placed next to each other and pressed in contact with a front panel 302. A second X/Y pair is shown alongside the arrangement, using the same X line interconnected by a wire or track 303 connected to a second X spring 304 and a second Y spring 305. In this embodiment, the electric field 306 coupling from the first X spring 300 to the first Y spring 301 also tends to couple 307 to the second Y spring 305. This may result in touch sensitivity of the second spring pair when touching over the first spring pair. This embodiment uses two springs per touch key.

Figure 4:
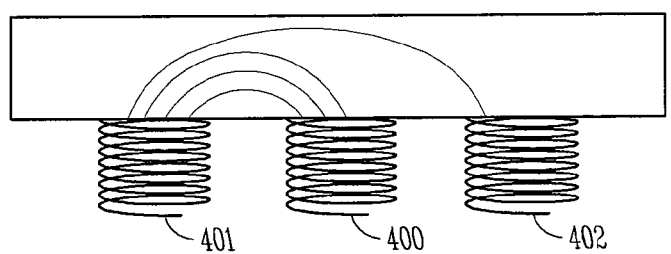
FIG. 4 is a cross section of an example electrode configuration using springs between the electrodes and a front panel according to an example embodiment.

In a further embodiment as shown in FIG. 4, a common Y spring 400 is shared by two X springs 401 and 402. Two touch keys are placed physically next to each other for this to function. The use of more than one Y line may result in some lack of key discrimination.

Figure 5A:
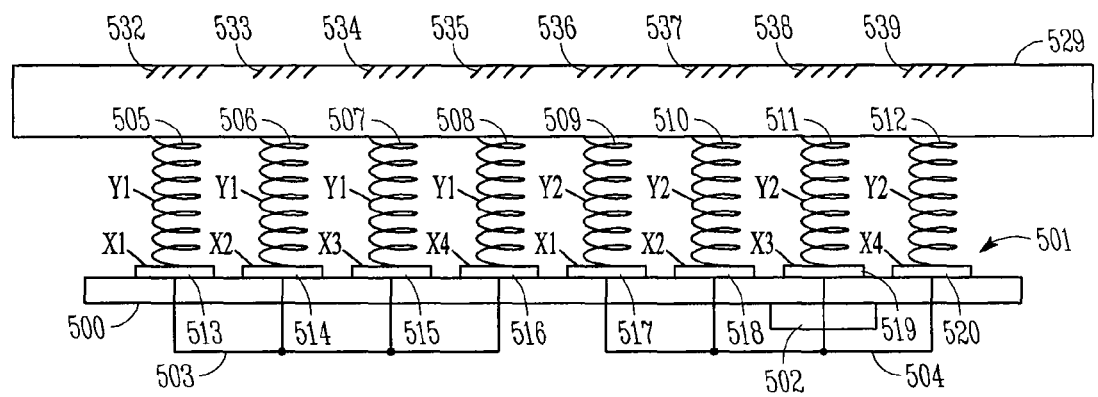
FIG. 5A is a cross section of an electrode configuration using springs between electrodes and a front panel according to an example embodiment.
Figure 5B:
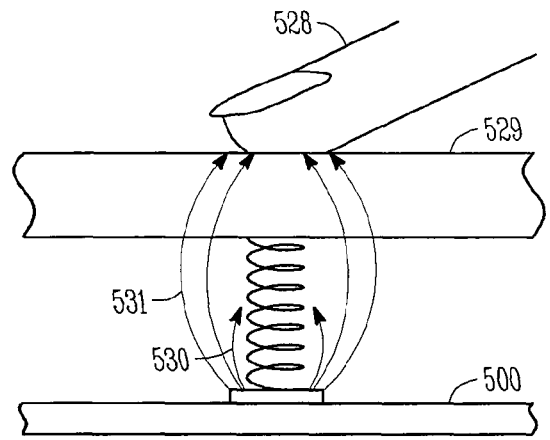
FIG. 5B is a cross section of an electrode pair with a spring showing a touch according to an example embodiment.

A further embodiment is shown in FIG. 5A. A substrate such as control PCB 500 is used to form all the X and Y electrode wiring 501. A control chip 502 may or may not be present on this control board, but is used to measure capacitive changes in the touch keys. The Y electrodes shown, Y1 503 and Y2 504 are connected to a set of Y electrode springs 505, 506, 507, and 508, and 509, 510, 511, and 512, the first group being electrically connected to Y1 and the second group to Y2, using traces on the PCB 500 to affect this interconnection. On the PCB 500 are formed a series of emitter X electrodes called X1 to X4 513, 514, 515, 516, 517, 518, 519 and 520. These electrodes are formed purely as conductive shapes on the surface of the PCB 500. In one embodiment, the X electrodes may be designed to substantially or completely surround the base of the Y springs 505, 506, 507, 508, 509, 510, 511, and 512. As can be seen, eight logical touch keys are so formed 532, 533, 534, 355, 536, 537, 528 and 539; X1Y1, X2Y1, X3Y1, X4Y1 and X1Y2, X2Y2, X3Y2, X4Y2. Hence a total of eight springs are used (505, 506, 507, 508, 509, 510, 511 and 512. The X electrodes, in one embodiment, have sufficient proximity to their neighboring Y spring to keep the electric fields well coupled locally. In FIG. 5B, a touching object 528 onto the front panel 529 now influences the coupled local X to Y field for predominantly the touch-adjacent touch key. Hence the key discrimination is good. The electric field for a single touch key is shown as 530 and its interaction with the touching object 528 is also shown at 531.

Figure 6A:
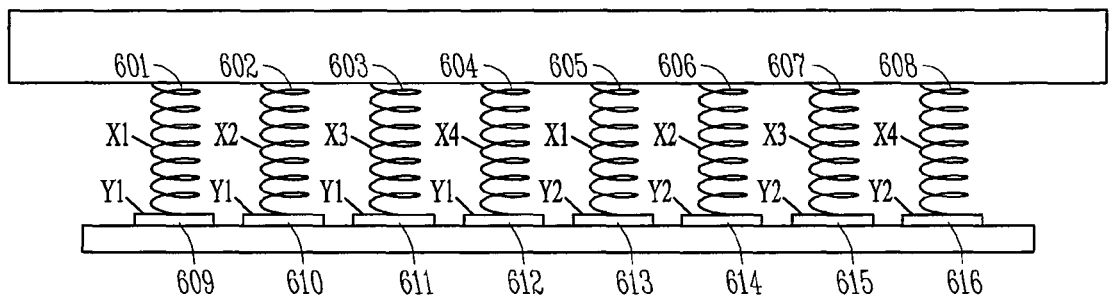
FIG. 6A is cross section of a further electrode configuration using springs between electrodes and a front panel according to an example embodiment.
Figure 6B:
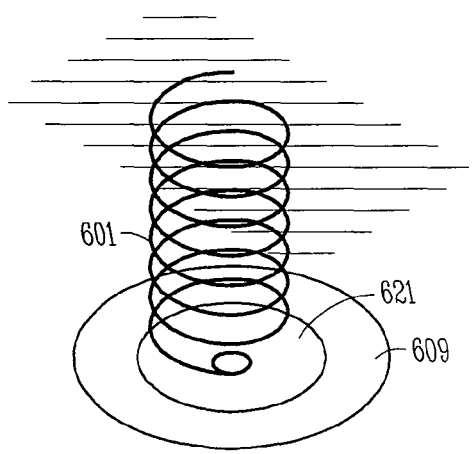
FIG. 6B is a perspective representation of a spring with electrodes according to an example embodiment.

An alternative scheme is shown in FIG. 6A where the springs 601, 602, 603, 604, 605, 606, 607, and 608 are now connected to X1 to X4 emitters and the PCB 600 electrodes 609, 610, 611, 612, 613, 614, 615 and 616 are connected to Y. FIG. 6B illustrates a perspective view of spring 601 coupled to an X emitter electrode 621. This alternate scheme may have an advantage in some applications where an improvement in key discrimination can be affected by virtue of the fact that the Y lines are rather more shielded by the X springs. Another potential advantage is that the Y electrode area can be reduced and hence help minimize noise injected into the Y line during touch. Attaining maximal signal to noise ratio in capacitive sensing systems helps to ensure reliable operation under electrically noisy conditions.

In some embodiments shown, the springs compress in such a way that the top of the spring forms a flat "spiral" disc. This lends itself well to coupling with the touching object and allowing an interaction with the electric field below the spiral.

In FIG. 6B, the X and Y electrodes 621 and 609 are shown as a disk 621 and concentric ring 609 physically separated from each other. Many other configurations of electrodes may be used in further embodiments. Further embodiments may feature increased shared electrode edges where field lines concentrate.

Figure 7A:
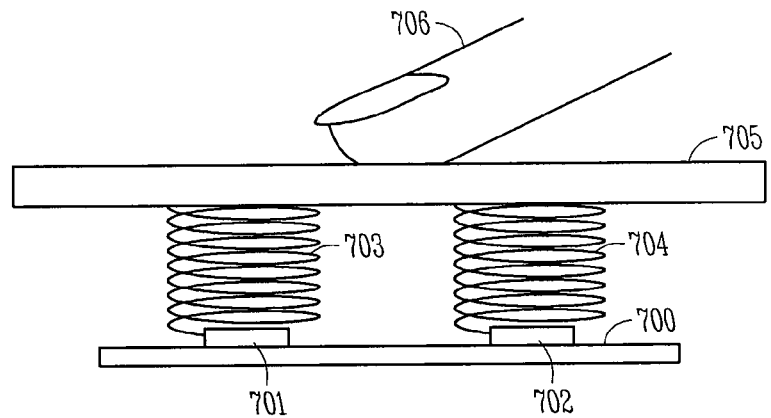
FIG. 7A is a cross section of an electrode configuration using springs between electrodes and a front panel according to an example embodiment.
Figure 7B:
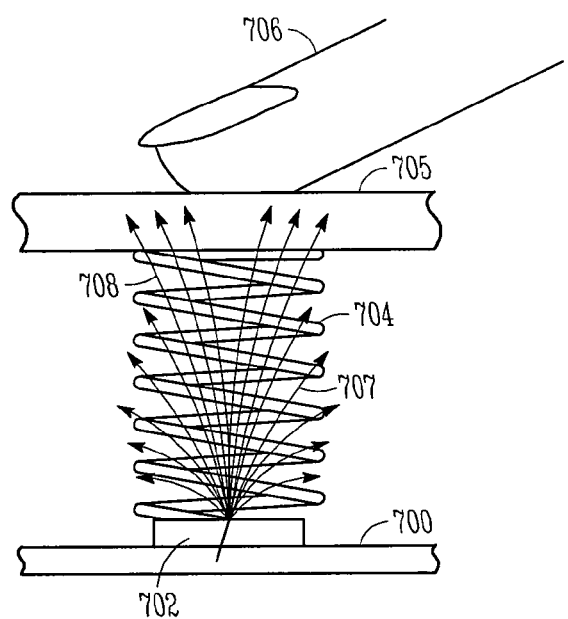
FIG. 7B is a cross section of an electrode pair with a spring showing a touch and electric field fringe lines according to an example embodiment.

An alternative arrangement uses a substantially coaxial arrangement, where the springs are connected to X and surround simple Y receiver electrodes on the PCB. This is shown in FIGS. 7A and 7B for a pair of touch keys. The PCB 700 uses conductive electrodes for the two Y1 receivers 701 and 702. The X1 emitter is formed from two springs 703 and 704. The front panel 705 and touching object 706 are shown together with an approximate field distribution 707 and touch interaction 708. As can be seen, the field is displaced away from the Y receiver in favor of the touching object 706. This causes a drop in capacitance between X and Y as with the other embodiments. This method has a distinct advantage that the springs can be very simple in design, with no special flat-top arrangement. The touching object 706 effectively touches "inside" the coils of the spring influencing the field 707 and 708. The spring can be driven from the PCB connection 700 using a contact formed by any conductive means e.g. solder, mechanical clip, glue or simple restraint against a conductive opposing pad on the PCB. Other methods will be obvious to those of normal skill in the art. This embodiment shares the advantage of FIGS. 6A and 6B in that the X spring acts to partly shield the Y receiver and the area of the Y receiver can be made relatively small to aid noise immunity.

Not shown is another embodiment, similar to FIGS. 7A and 7B where the springs are connected to Y and the PCB electrodes to X. In a similar way as described in the previous examples, this is equally valid but may show degraded key discrimination and noise immunity in some applications.

Figure 8:
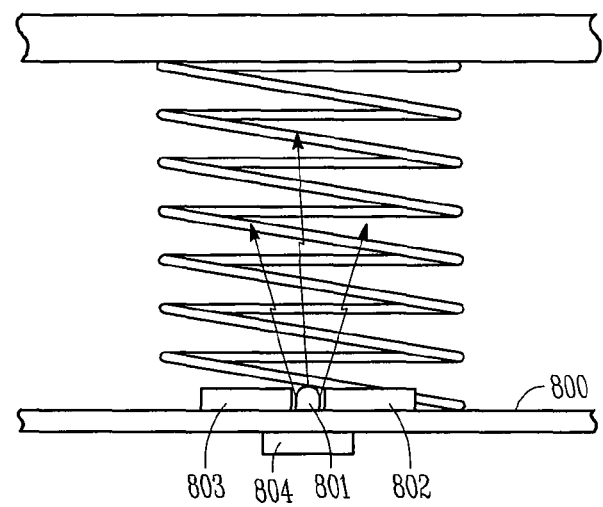
FIG. 8 is a cross section of an electrode configuration having a hole and spring according to an example embodiment.
Figure 9:
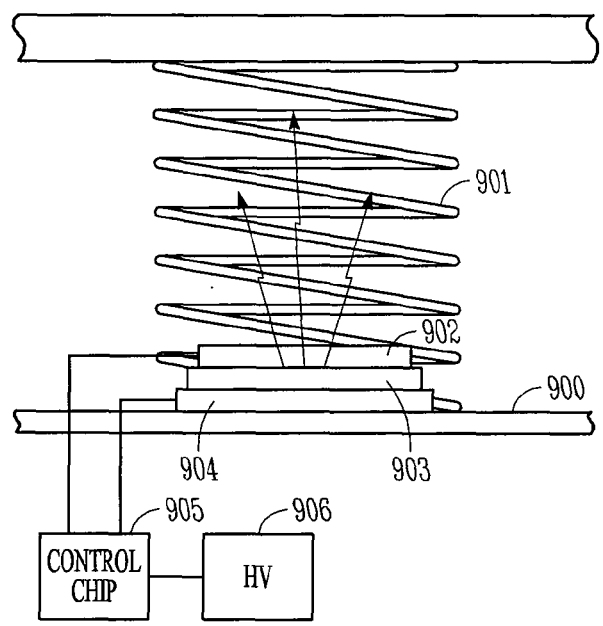
FIG. 9 is a cross section of an electrode configuration having electroluminescent light generation and a spring according to an example embodiment.

In FIGS. 7A and 7B it should be understood that the Y electrode shape can take various forms. Importantly, as shown in FIG. 8, this can include a hole 801 in the electrode 802 formed on the PCB 800. This is very useful to facilitate the placement of a light emitting device, shown in two alternative positions 803 and 804. There are many configurations of electrode and hole that can be devised. It is also possible to form the PCB electrode from a conductive material that is substantially transparent to allow light to shine through from below. It is also possible to combine the electrode with some form electroluminescent light generation local to the centre of each spring. This is shown in FIG. 9. The PCB 900 and spring 901 are shown, and in the middle of the spring 901 is shown an electrode structure where a transparent Y electrode 902 is formed on top of a phosphor 903 layer and a second electrode 904 that may be either grounded or actively driven. A control chip 905 time multiplexes capacitive measurements with electroluminescent high voltage drive 906 periods. This arrangement permits the light emitting layer to be created directly beneath the touch key active area with a very low profile and uniform illumination.

A similar light emission method can also be conceived where rather than an electroluminescent layer being used, instead a light diffuser sheet is placed below the PCB electrodes (again, being of substantially transparent material to allow the light to pass upwards towards the panel). The light diffuser sheet is well known in the art and typically is illuminated from the edges, uses total-internal-reflection (TIR) to guide the light to chosen areas where is then allowed to escape using a variety of techniques to disrupt the TIR process (mechanical stress, small ridges on the surfaces, refractive index mismatches etc).

Figure 11:
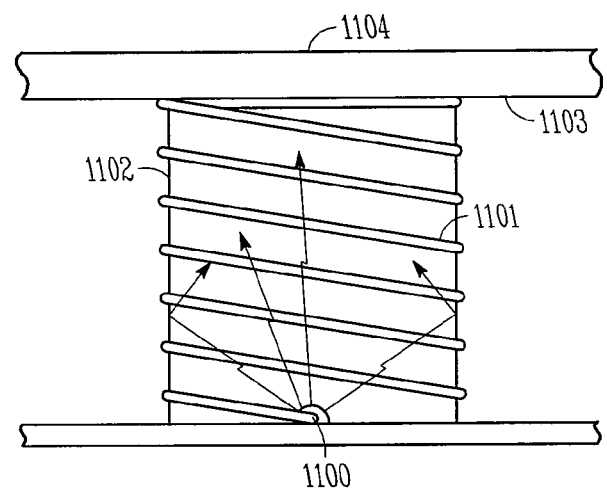
FIG. 11 is a cross section representation of an electrode configuration with a light emitting diode and spring according to an example embodiment.

Another illumination method is shown in FIG. 11. Here, a coaxially mounted light emitting device 1100 in the centre of the spring 1101, uses a reflective sleeve 1102 running up the inside of the spring 1101 and stopping just before the inner surface 1103 of the front panel 1104. The sleeve may be made of any reflective material.

Figure 10:
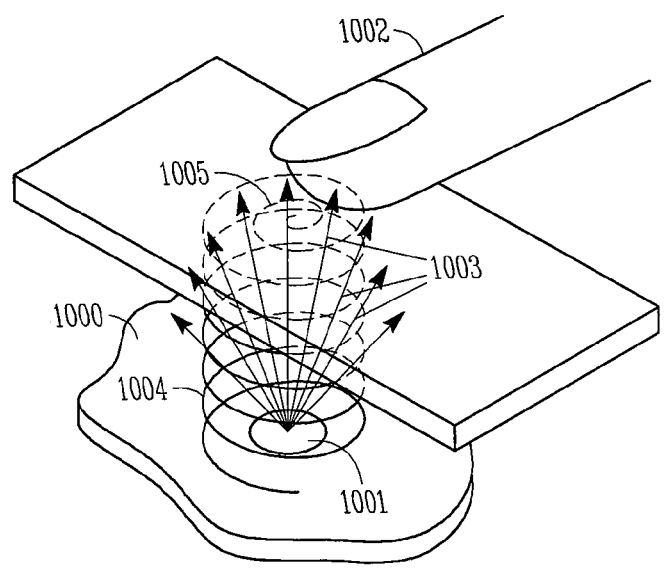
FIG. 10 is a perspective representation of an electrode configuration having a light diffuser and a spring according to an example embodiment.

The spring used in FIG. 7 can also utilize an inward compressible spiral that flattens on compression. This is shown in FIG. 10. An advantage of this method is that it helps to even more completely shield the electrode below 1001. This may provide noise suppression advantages. The coil of the spring that spirals inwards 1005 may have a moderately open structure to allow the touching object 1002 to interact with the electric field 1003 formed between the spring 1004 and the electrode 1001 on the PCB 1000.

The invention claimed is:

1. A device comprising:
    a substrate;
    a top touch panel;
    a first conductive compressible electrode supported by the substrate and extending from the substrate to the top touch panel;
    a second conductive compressible electrode supported by the substrate and extending from the substrate to the top touch panel;
    a third electrode connected to the first and second conductive compressible electrodes;
    a fourth electrode supported by the substrate and arranged to form an electric field coupling with the first conductive compressible electrode, wherein the first conductive compressible electrode and the fourth electrode are physically separated from each other such that an object touching the top touch panel proximate to the first conductive compressible electrode causes a change in capacitance between the first conductive compressible electrode and the fourth electrode; and
    a fifth electrode supported by the substrate and arranged to form an electric field coupling with the second conductive compressible electrode, wherein the second conductive compressible electrode and the fifth electrode are physically separated from each other such that an object touching the top touch panel proximate to the second conductive compressible electrode causes a change in capacitance between the second conductive compressible electrode and the fifth electrode.

2. The device of claim 1 wherein the first and second conductive compressible electrodes are held in compression between the substrate and the top touch panel.

3. The device of claim 1 wherein the first and second conductive compressible electrodes are transmitter electrodes and the fourth and fifth electrodes are receiver electrodes.

4. The device of claim 1 wherein the first and second conductive compressible electrodes are receiver electrodes and the fourth and fifth electrodes are transmitter electrodes.

5. The device of claim 1 wherein the fourth electrode partially surrounds the first conductive compressible electrode.

6. The device of claim 5 wherein the first conductive compressible electrode includes a portion formed in the shape of a disk, and the fourth electrode comprises a ring concentric with the disk, wherein the ring and the portion formed in the shape of a disk are physically separated from each other.

7. The device of claim 1 wherein:
    the first conductive compressible electrode compresses against the top touch panel to form a first touch area on the top touch panel corresponding to the area at which the first conductive compressible electrode compresses against the top touch panel; and
    the second conductive compressible electrode compresses against the top touch panel to form a second touch area on the top touch panel corresponding to the area at which the second conductive compressible electrode compresses against the top touch panel.

8. The device of claim 1 and further comprising a light source corresponding to the first conductive compressible electrode and the fourth electrode.

9. The device of claim 8 wherein the light source comprises an electroluminescent material.

10. The device of claim 1 wherein the fourth electrode has a hole, and wherein the device further comprises a light source to provide light through the hole.

11. The device of claim 10 wherein the light source comprises a light emitting diode supported by the substrate.

12. The device of claim 1 wherein the substrate comprises a printed circuit board having separate wiring for the first conductive compressible electrode and the fourth electrode, and wherein the top touch panel is formed of material including plastic or glass.

13. The device of claim 1 wherein the substrate provides mechanical support for the first and second compressible electrodes and the fourth and fifth electrodes and includes discrete wiring coupled to the first conductive compressible electrode, the fourth electrode, and the fifth electrode.

14. The device of claim 1 wherein each of the first and second conductive compressible electrodes comprises a conductive spring extending from the substrate to the top touch panel.

15. A device comprising:
- a substrate;
- a top touch panel;
- a plurality of first electrodes supported by the substrate, each first electrode including an electrically conducting spring extending from the substrate to the top touch panel;
- a second electrode connected to each of the first electrodes;
- a plurality of third electrodes supported by the substrate, each third electrode including an electrically conducting spring extending from the substrate to the top touch panel;
- a fourth electrode connected to each of the third electrodes;
- a plurality of fifth electrodes supported by the substrate, each fifth electrode arranged to form an electric field coupling with a respective first electrode and a respective third electrode, wherein the respective first electrode and the fifth electrode are physically separated from each other such that an object touching the top touch panel adjacent to the respective first electrode causes a change in capacitance between the respective first electrode and the fifth electrode, and wherein the respective third electrode and the fifth electrode are physically separated from each other such that an object touching the top touch panel adjacent to the respective third electrode causes a change in capacitance between the respective third electrode and the fifth electrode.

16. The device of claim 15 wherein the electrically conducting spring associated with each first electrode is formed to conduct charge to a touch area on the top touch panel proximate a point at which the electrically conducting spring contacts the top touch panel.

17. The device of claim 16 wherein the substrate comprises a printed circuit board having a first conductor coupled to the first electrodes, a second conductor coupled to the third electrodes, and a plurality of third conductors, each third conductor coupled to a respective first electrode.

18. The device of claim 15 and further comprising a light source corresponding to one of the first and fifth electrodes.

19. The device of claim 15 wherein one of the first electrodes has a hole, and wherein the device further comprises a light source to provide light through the hole.

20. The device of claim 15 wherein the electrically conducting spring associated with each first electrode compresses to form a flat spiral ring adjacent the top touch panel.

21. A method comprising:
- forming a first and a second electrode supported on a substrate such that they form an electric field coupling, wherein the first electrode is formed of a first compressible conductive material;
- forming a third electrode supported on the substrate such that the second and third electrodes form an electric field coupling, wherein the third electrode is formed of a second compressible conductive material;
- compressing the first compressible conductive material with a top touch panel to form a first touch area on the top touch panel proximate a compressed region of the first compressible material in contact with the top touch panel, wherein the first and second electrodes are physically separated from each other such that an object touching the top touch panel causes a change in capacitance between the first electrode and the second electrode; and
- compressing the second compressible conductive material with a top touch panel to form a second touch area on the top touch panel proximate a compressed region of the second compressible material in contact with the top touch panel, wherein the second and third electrodes are physically separated from each other such that an object touching the top touch panel causes a change in capacitance between the third electrode and the second electrode.

22. The method of claim 21 wherein a touch on the first touch area removes charge transferable between the first and second electrodes.

* * * * *